United States Patent [19]
Ogasawara et al.

[11] Patent Number: 5,793,041
[45] Date of Patent: Aug. 11, 1998

[54] METHOD FOR CORRECTING ASTIGMATISM AND FOCUSING IN CHARGED PARTICLE OPTICAL LENS-BARREL

[75] Inventors: Munehiro Ogasawara, Fujisawa; Shuichi Tamamushi, Kawasaki; Kazunori Onoguchi, Osaka; Hideo Wakamori, Tokyo, all of Japan

[73] Assignee: Kabushiki Kaisha Toshiba, Kawasaki, Japan

[21] Appl. No.: 711,263

[22] Filed: Sep. 9, 1996

[30] Foreign Application Priority Data

Sep. 14, 1995 [JP] Japan ................... 7-237456

[51] Int. Cl.$^6$ ................... H01J 37/10
[52] U.S. Cl. ............ 250/307; 250/310; 250/396 R
[58] Field of Search ................ 250/307, 310, 250/396 R

[56] References Cited

U.S. PATENT DOCUMENTS

| | | | |
|---|---|---|---|
| 4,695,725 | 9/1987 | Mori et al. | 250/311 |
| 4,818,873 | 4/1989 | Herriot | 250/310 |
| 5,047,646 | 9/1991 | Hattori et al. | 250/396 R |
| 5,134,288 | 7/1992 | Van Dijck | 250/307 |
| 5,144,129 | 9/1992 | Kobayashi et al. | 250/310 |
| 5,654,547 | 8/1997 | Coene et al. | 250/307 |

FOREIGN PATENT DOCUMENTS

| | | |
|---|---|---|
| 0 472 235 | 2/1992 | European Pat. Off. |
| 3-194839 | 8/1991 | Japan . |
| 6-16389 | 3/1994 | Japan . |

OTHER PUBLICATIONS

Patent Abstracts of Japan, JP-A 63 202835, Aug. 22, 1988.
Patent Abstracts of Japan, JP-A-61 290640, Dec. 20, 1986.
Patent Abstract of Japan, JP-A-58 137948, Aug. 16, 1983.
Micron and Microscopia Acta, vol. 20, No. 3/4, pp. 179-192, 1989, K. Kanaya, et al., "An Automatic Focusing and Astigmatism Correction Method for High Resolution Electron Microscopy".
Scanning Microscopy, vol. 1, No. 4, pp. 1507-1514, 1987, N. Baba, et al., "An Algorithm for Online Digital Image Processing for Assisting Automatic Focusing and Astigmatism Correction in Electron Microscopy".
Transactions of the Society of Instrument and Control Engineers, vol. 22, No. 8, pp. 865-870, Aug. 1980, F. Kobayashi, et al., "High-Speed Detection of Astigmatism in Electron Microscope Using the Radon Transform".

Primary Examiner—Bruce Anderson
Attorney, Agent, or Firm—Oblon, Spivak, McClelland, Maier & Neustadt, P.C.

[57] ABSTRACT

In a method for correcting astigmatism and focusing in a charged particle optical lens-barrel, according to the invention, Fourier transformation data items are obtained, which indicate images obtained by scanning a sample with a charged particle beam when the focal distance of an objective lens is set to each of at least two different values. Then, the configuration of the section of the beam is determined on the basis of the difference between the data items, thereby performing astigmatism correction and focusing. As a result, a charged particle microscope can perform highly accurate astigmatism correction and focusing during observation, irrespective of the surface configuration of the sample or the beam section on the sample.

11 Claims, 4 Drawing Sheets

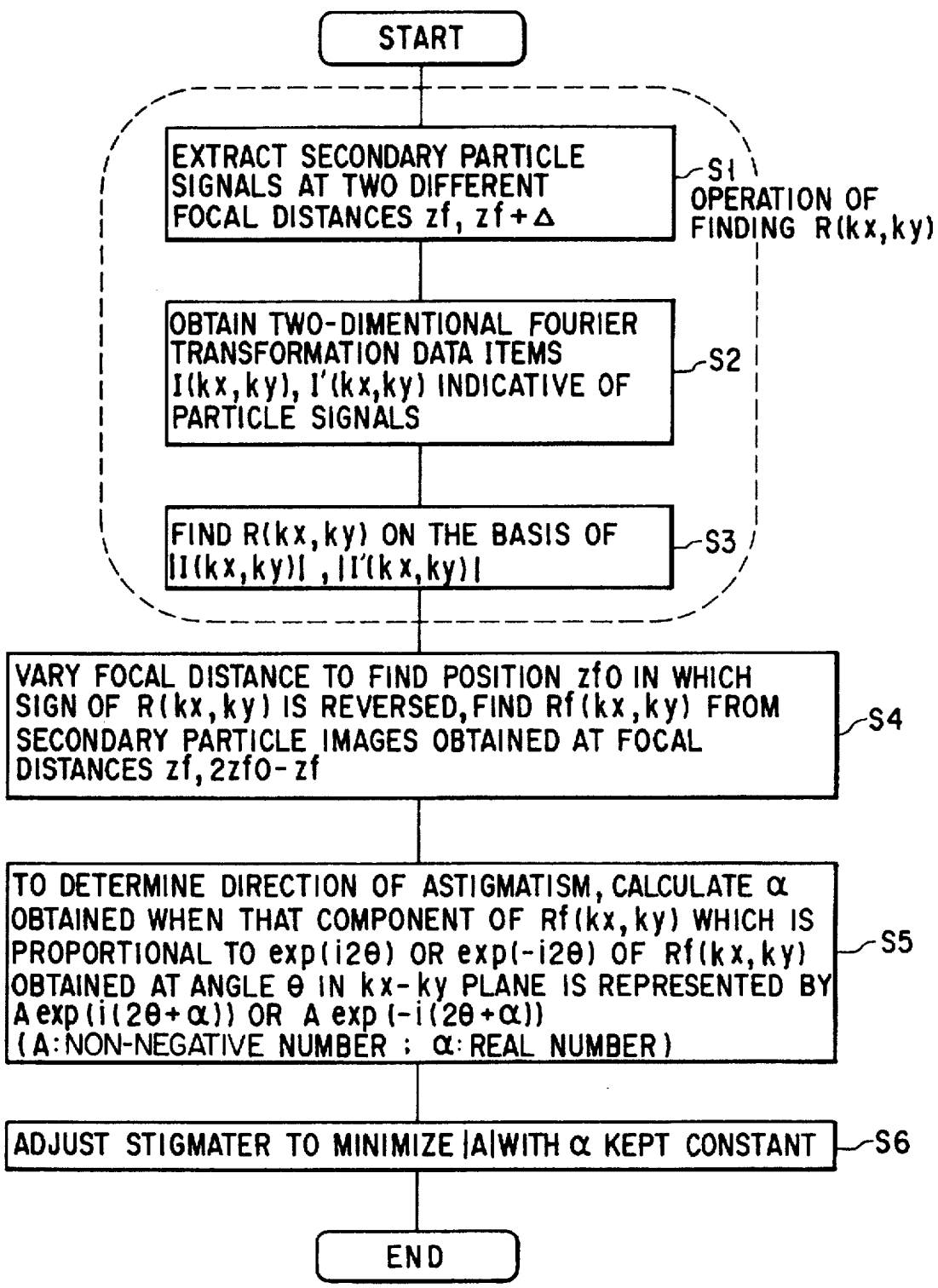
F I G. 1

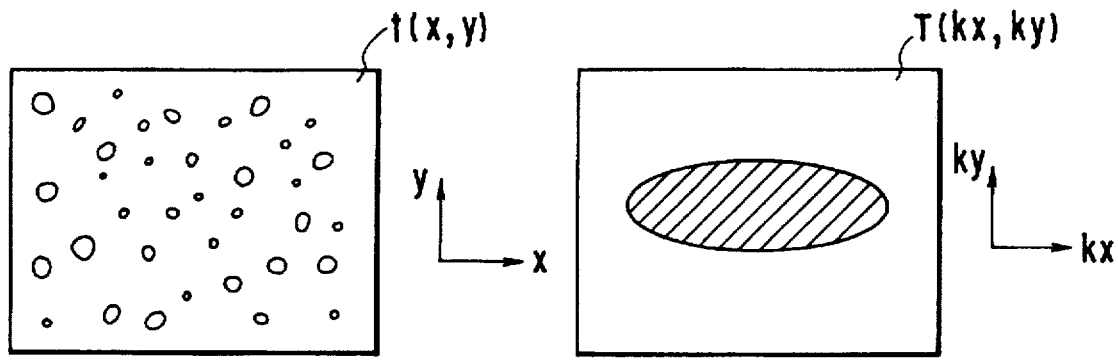
F I G. 2A    F I G. 2B
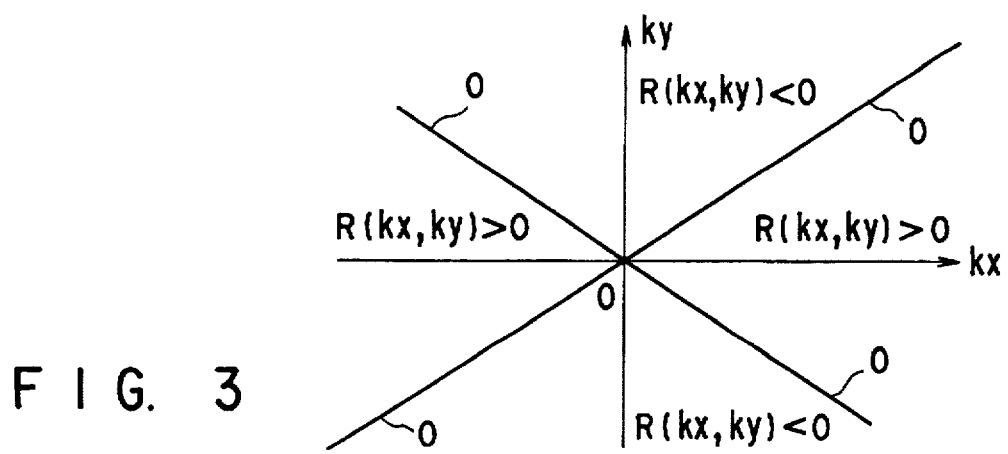
F I G. 3
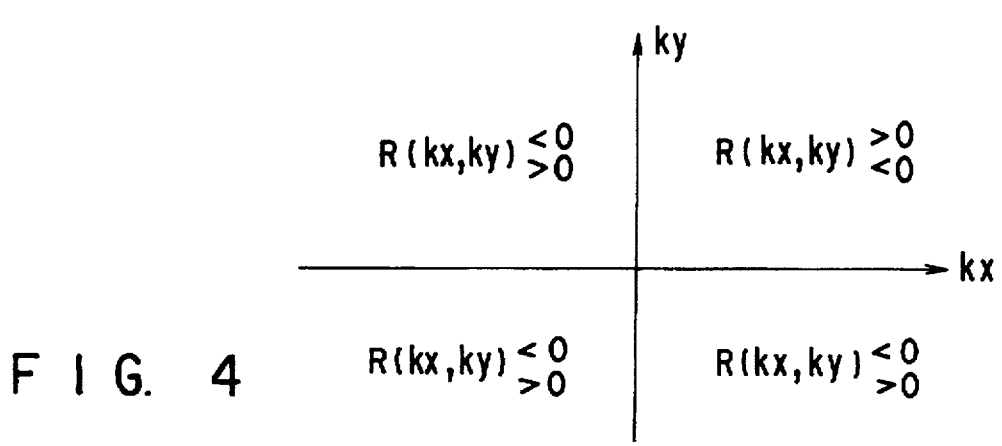
F I G. 4

FIG. 6A
FIG. 6B
FIG. 6C
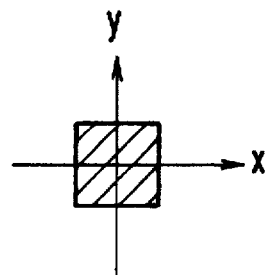
FIG. 7A
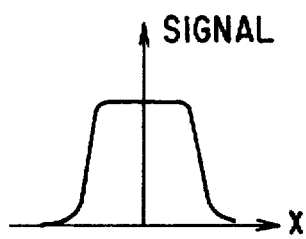
FIG. 7B
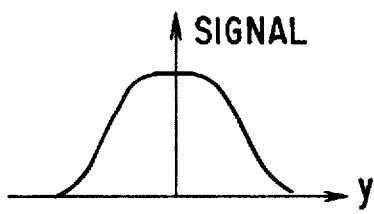
FIG. 7C
FIG. 8A
FIG. 8B
FIG. 8C
FIG. 9A
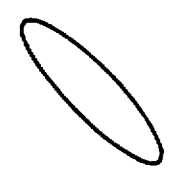
FIG. 9B
FIG. 9C

METHOD FOR CORRECTING ASTIGMATISM AND FOCUSING IN CHARGED PARTICLE OPTICAL LENS-BARREL

BACKGROUND OF THE INVENTION

1. Field of the Invention

This invention relates to a method for correcting astigmatism and focusing in a charged particle optical lens-barrel such as a scanning charged particle microscope used to observe a fine pattern, for example, of a semiconductor element and a charged particle drawing apparatus used to make a fine pattern on a surface of a semiconductor.

2. Description of the Related Art

In general, an electron microscope is used to observe the state of the surface of a semiconductor element. In the case of using a general scanning electron microscope, its resolution is less than 1 nm.

Referring to FIG. 5, the structure of a typical high resolution scanning electron microscope will be described. In FIG. 5, an electron gun 3 of a field emission type is constituted by a cathode 1 and an anode 2, and can generate an electron beam 4 of a high brightness. The electron beam 4 is further converged through a condenser lens 5, a restriction 7 and an objective lens 6, and converged on the surface of a sample 8. At this time, a detector 11 detects secondary electrons radiated from the sample surface. The electron beam 4 is controlled by a deflector 10 controlled by a scan control circuit 12, thereby two-dimensionally scanning the sample 8 placed on a sample table 9. A signal output from the detector 11 is displayed on an image display unit 13 in synchronism with the two-dimensional scan, thereby providing data concerning the sample surface.

In a converging system using a lens such as the objective lens 6, aberration generally called "astigmatism" is found. This phenomenon occurs since the beam-converged area is deformed in two directions perpendicular to the axis of a beam. Where astigmatism exists, the beam section on the sample deforms as shown in FIGS. 6A–6C in accordance with focal distances of the objective lens 6. The circular section of the beam shown in FIG. 6B has a diameter larger than that obtained when such astigmatism does not exist. Such astigmatism occurs since the focal distance of the lens differs in two directions.

To correct the astigmatism, two means for generating a quadruple electric or magnetic field, which are called "stigmators", are used to generate the fields in directions deviated by 45° from each other. The focal distances in the two directions are made identical to each other by adjusting the intensities of the two means.

Referring then to FIGS. 7A–7C, the actual adjusting method will be described. At the time of observing a rectangular pattern as shown in FIG. 7A, if the beam has a section as shown in FIG. 6A, an image displayed on a television has a high edge resolution in a direction as shown in FIG. 7B and a low edge resolution in another direction as shown in FIG. 7C. If, on the other hand, the beam has a section as shown in FIG. 6C as a result of changing the focal distance of the objective lens 6, the directions in which the image has the high and low resolutions are replaced with each other. To avoid this, the two stigmators are adjusted so that the image can have a uniform resolution even when the focal distance of the objective lens 6 is changed. As a result, the beam has sections as shown in FIGS. 8A–8C.

In the case where the beam has sections as shown in FIGS. 9A–9C, if a sample as shown in FIG. 7A is observed using the beam, astigmatism is hard to correct. The same can be said of automatic astigmatism correction.

The operation for performing automatic astigmatism correction will now be described briefly. First, the contrast of each of images obtained at different focal distances is obtained, thereby determining that one of the focal distances at which the contrast is maximum. It is possible that the contrast is maximum at two focal distances when the astigmatism is great. In such a case, the intermediate distance of the two focal distances is selected. At the thus-determined focal distance, the stigmator located in the x-axis direction is adjusted to maximize the contrast, and then the stigmator located in the y-axis direction is adjusted to maximize the contrast. This operation is repeated to find an optimal focal distance.

The aforementioned manual adjusting method, however, has the following problems:

Since the adjustment is performed using the visual sense of the operator, the accuracy of adjustment depends upon the experience or ability of the operator. Further, the manual adjustment requires a great amount of time, which may result in a great amount of radiation on a sample, and hence may well damage the sample or vary the configuration of a resist on the sample. Moreover, correction is difficult when the sample has an irregular complicated shape with portions which extend in various directions.

In addition, the method for automatically correcting astigmatism is limited in its application range as compared with the manual correction, and in most cases the automatic astigmatism correction is more degraded than the manual correction. If the sample has a complicated shape, the accuracy of correction is particularly reduced.

The above problems are especially serious in the case of using an electron beam drawing apparatus which used a shaped beam with a rectangular or triangular section, or a character beam with a section of a voluntary configuration. Since in this case, an image of a sample includes data concerning the beam configuration in addition to data concerning the sample itself, astigmatism correction is furthermore difficult.

SUMMARY OF THE INVENTION

The invention has been developed under the above-described circumstances, and aims to provide a method for enabling a charged particle optical lens-barrel to correct astigmatism at high speed and with high accuracy to thereby prevent degradation of observation accuracy due to the configuration of a sample or that of a beam section.

According to an aspect of the invention, there is provided a method of correcting astigmatism and focusing in a charged particle optical lens-barrel, comprising: the first step of extracting secondary particle signals obtained by two-dimensionally scanning a sample with a charged particle beam when the focal distance of an objective lens is set to each of at least two different values; the second step of representing by $I(kx, ky)$ and $I'(kx, ky)$, respectively, Fourier transformation data items in a two-dimensional region indicative of the secondary particle signals extracted in the first step; the third step of calculating $R(kx, ky)$ on the basis of the absolute values $|I(kx, ky)|$ and $|I'(kx, ky)|$ of $I(kx, ky)$ and $I'(kx, ky)$ represented in the second step; the fourth step of determining the direction of astigmatism on the basis of $\alpha$ obtained when that component of $R(kx, ky)$ calculated in the third step, which is proportional to $\exp(i2\theta)$ or $\exp(-i2\theta)$ of $R(kx, ky)$ obtained at an angle $\theta$ in a kx-ky plane, is represented by $A\exp(i(2\theta+\alpha))$ or $A\exp(-i(2\theta+\alpha))$ (A:

a non-negative number; α: a real number); and the fifth step of adjusting a stigmator so as to minimize the real number.

According to another aspect of the invention, there is provided a method of correcting astigmatism and focusing in a charged particle optical lens-barrel, comprising: the first step of extracting secondary particle signals obtained by two-dimensionally scanning a sample with a charged particle beam when the focal distance of an objective lens is set to each of at least two different values; the second step of representing by I(kx, ky) and I′ (kx, ky), respectively, Fourier transformation data items in a two-dimensional region indicative of the secondary particle signals extracted in the first step; the third step of calculating R(kx, ky) on the basis of the absolute values |I(kx, ky)| and |I′ (kx, ky)| of I(kx, ky) and I′ (kx, ky) represented in the second step; the fourth step of further changing the focal distance to obtain Fourier transformation data I″ (kx, ky) in a third quadrant, then calculating new R(kx, ky) on the basis of I′ (kx, ky) and I″ (kx, ky), repeating this operation until the sign of R(kx, ky) is reversed, and calculating R(kx, ky) on the basis of a focal distance at which the sign is reversed; the fifth step of determining the direction of astigmatism on the basis of α obtained when that component of R(kx, ky) calculated in the third step, which is proportional to exp(i2θ) or exp(−i2θ) of R(kx, ky) obtained at an angle θ in a kx-ky plane, is represented by Aexp(i(2θ+α)) or Aexp(−i(2θ+α)) (A: a non-negative number; α: a real number); and the sixth step of adjusting a stigmator so as to minimize the real number A.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 1 is a flowchart, useful in explaining a method for correcting astigmatism in a charged particle optical lens-barrel, according to the embodiment of the invention;

FIG. 2A shows the configuration of a surface portion of a sample;

FIG. 2B is a view obtained by subjecting FIG. 2A to Fourier transformation;

FIG. 3 is a view, showing a distribution of R(kx, ky) used in the embodiment of the invention and obtained when the beam section is deformed in the x- or y-axis direction;

FIG. 4 is a view, showing a distribution of R(kx, ky) used in the embodiment of the invention and obtained when the beam section is deformed in a direction which inclines at 45° to the x- and y-axis directions;

FIG. 6A shows the configuration of a beam section obtained when the focal distance of a lens is varied in a case where y-axis directionally deforming astigmatism exists;

FIG. 6B shows the configuration of a beam section obtained when the focal distance of a lens is varied in a case where the beam section is round between the positions for FIGS. 6A and 6C;

FIG. 6C shows the configuration of a beam section obtained when the focal distance of the lens is varied further from the position of FIG. 6B;

FIG. 7A shows the configuration of the surface of a rectangular sample;

FIG. 7B shows a distribution of secondary electron signals obtained when the beam of FIG. 6A is scanned in the x-axis direction;

FIG. 7C shows a distribution of secondary electron signals obtained when the beam of FIG. 6A is scanned in the y-axis direction;

FIG. 8A shows the configuration of a beam section obtained when the focal distance of the lens employed in the case of FIG. 6A is varied;

FIG. 8B shows the configuration of a beam section obtained when the focal distance of the lens employed in the case of FIG. 6B is varied;

FIG. 8C shows the configuration of a beam section obtained when the focal distance of the lens employed in the case of FIG. 6C is varied;

FIG. 9A shows the configuration of a beam section obtained when the focal distance of a lens is varied in a case where astigmatism exists which will deform the beam section such that it inclines at 45° to the x- and y-axis directions;

FIG. 9B shows the configuration of a beam section obtained when the focal distance of a lens is varied in a case where the beam section is round between the positions for FIGS. 9A and 9C; and FIG. 9C shows the configuration of a beam section obtained when the focal distance of a lens is varied further from the position of FIG. 9B.

DETAILED DESCRIPTION OF THE PREFERRED EMBODIMENTS

Figure 5:
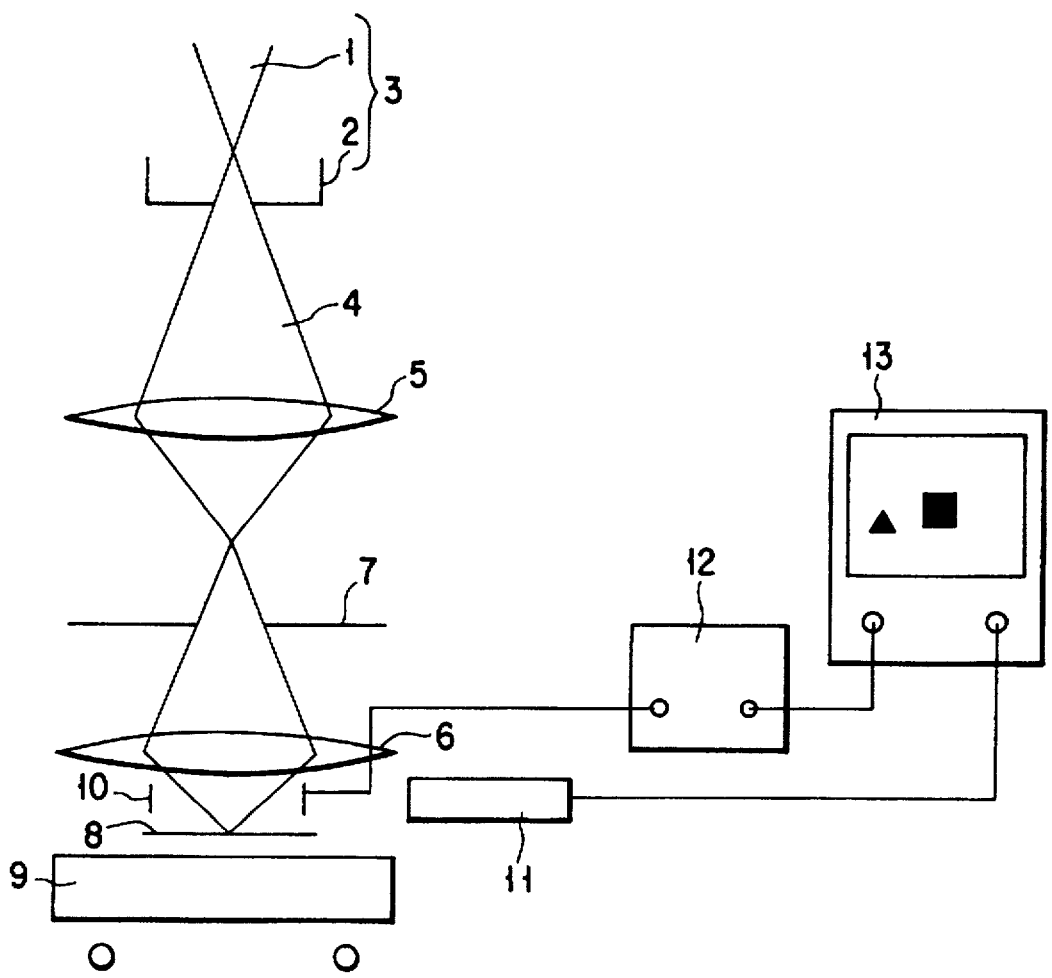
FIG. 5 shows an SEM employed in the conventional case.

Referring to FIGS. 1–3, a method for correcting astigmatism and focusing in a charged particle optical lens-barrel according to the embodiment of the invention will be described.

Suppose that an image obtained by observing a sample with a pattern t(x, y) as shown in FIG. 2A by applying a beam thereto is expressed by i(x, y). If the level of a signal output from the aforementioned detector 11 shown in FIG. 4 is proportional to the beam current, the image i(x, y) is given by $$i(x, y) = \iint o(x-x0, y-y0) \, t(x0, y0) \, dx0 \, dy0$$

where o(x−x0, y−y0) represents the current distribution of the beam assumed when the center of the beam is situated at (x0, y0). In this equation, proportional constants are omitted, and the range of integration can be set to an ±∞ in both the x- and y-axis directions.

If the items i(x, y), o(x, y) and t(x, y) of the equation are changed to I(kx, ky), O(kx, ky) and T(kx, ky) as a result of Fourier transformation, the following equation is given:

$$I(kx, ky) = O(kx, ky) \, T(kx, ky)$$

In practice, it is a matter of course that sufficiently approximate data can be obtained even if the range of integration in Fourier transformation is limited to the SEM image region.

As described above, it is supposed that the distribution i(x, y) of secondary electrons is given by $$i(x, y) = \iint o(x-x0, y-y0) \, t(x0, y0) \, dx \, dy$$

However, the actually obtained i(x, y) includes a finite signal value i0 as follows even if the amount of secondary electrons is 0:

$$i(x, y) = \iint o(x-x0, y-y0)\, t(x0, y0)\, dx_0\, dy_0 + i0$$

In this case, the value i0 is calculated, for example, under the condition that no secondary electrons will occur even when a beam is radiated from a Faraday cup, etc. placed on a stage. Once the value i0 is obtained, it suffices if the following calculation is executed by replacing i(x, y) with i(x, y)−i0.

If o(x, y) has axes of symmetry perpendicular to each other, O(kx, ky) is a real number region. If T(kx, ky) is uniform, |I(kx, ky)| is determined on the basis of |O(kx, ky)| as shown in FIG. 2B.

Further, if the current distribution of a beam is proportional to $\exp(-(x \times kx0)^2/2 - (y \times ky0)^2/2)$, the configuration of the section of the beam can be estimated from O(kx, ky), using the following formula:

$$O(kx, ky) \propto \exp(-(kx/kx0)^2/2 - (ky/ky0)^2/2)$$

Actually, however, T(kx, ky) is not uniform and hence I(kx, ky) includes not only data O(kx, ky), but also data T(kx, ky).

If Fourier transformation data I' (kx, ky) corresponding to an image obtained when the focal distance of a lens is set to a certain value satisfies the following equation:

$$R(kx,ky) = \text{Real}\left((I(kx,ky)-I'(kx,ky))/(I(kx,ky)+I'(kx,ky))\right) \text{ (where I }(kx,ky) \text{ or } I'(kx,ky) \text{ is not 0)}$$

then, the following equation is established:

$$R(kx,ky) = \text{Real}\left((O(kx,ky)-O'(kx,ky))/(O(kx,ky)+O'(kx,ky))\right)$$

The above equations directly relate I(kx,ky) and I' (kx,ky) to the Fourier transformation data O(kx,ky) and O' (kx,ky) of the beam current distribution. Although a real number portion of R(kx,ky) is selected in the first equation concerning I(kx,ky), such selection is not necessary if O(kx,ky) is a real number region. In practice, however, R(kx,ky) may well be a complex number because of degraded measurement accuracy or a calculation error in a calculator or a small error of symmetry of O(kx,ky). In such a case, selection of a real number portion is necessary.

Further, suppose that:

$$O(kx,ky) = A\exp(-(kx/kx0)^2/2 - (ky/ky0)^2/2)$$
$$O''(kx,ky) = A'\exp(-(kx/kx0')^2/2 - (ky/ky0')^2/2)$$

where A=A'>0 from the equation $\iint o(x, y)dxdy = \iint o'(x, y)dxdy$.

If o(x, y) is a current distribution assumed when the beam has a configuration as shown in FIG. 6A, and o' (x, y) is a current distribution assumed when the beam has a configuration as shown in FIG. 6B, kx>kx' and ky<ky' are established, and accordingly R(kx, ky) has negative and positive signs as shown in FIG. 3.

The distribution of FIG. 3 reflects the variations in beam current distribution, which do not relate to the Fourier transformation data T(kx, ky) concerning the pattern of the sample. The value B of the angular component Bexp(2iθ) of the kxky plane of the resultant R(kx, ky) is a real number. This means that if the value B is a real number, the beam section is deformed in the x- or y-axis direction.

Similarly, supposing that a current distribution in an XY coordinate plane which inclines at 45° to the xy coordinate plane is given by $$O(X, Y) \propto \exp(-(K1 \times X)^2/2 - (K2 \times Y)^2/2)$$

then, the following equation is established in KxKy coordinate plane which inclines at 45° to the kxky coordinate plane:

$$O(Kx,Ky) = A\exp(-(Kx/K1)^2/2 - (Ky/K2)^2/2)$$

In this case, R(kx, ky) has opposite signs in adjacent quadrants as shown in FIG. 4.

If the angular component Bexp (2iθ) of the distribution in the kxky plane is found in a manner similar to the above, B is B0exp(±iπ/2) (B0: a positive real number). In this case, the sign depends upon the values of K1 and K2 assumed when the focal distance is varied. In other words, the beam section is deformed in a direction which inclines at 45° to the x- and y-axis directions.

This means that when the phase of B is π/2, the beam section is determined to be deformed in a direction which inclines at 45° to the x- and y-axis directions. Moreover, the direction of deformation is also determined only on the basis of the axes of symmetry of R(kx, ky).

For example, supposing that:

$$O(kx,ky) \propto \exp(-(kx/kx0)^2/2 - (ky/ky0)^2/2)$$
$$O'(kx,ky) \propto \exp(-(kx/kx0')^2/2 - (ky/ky0')^2/2)$$

then, R(kx, ky) is given by $$R(kx, ky) = (1 - \exp(-(kx/kx0')^2/2 - (ky/ky0')^2/2 + (kx/kx0)^2/2 - (ky/ky0)^2/2)) / (1 + \exp(-(kx/kx0')^2/2 - (ky/ky0')^2/2 + (kx/kx0)^2/2 - (ky/ky0)^2/2))$$

This distribution is symmetric with respect to the kx-axis and the ky-axis. From this, it is determined that the beam section is deformed in the x- and y-axis directions.

In the case where the above contents are generalized, and the angular component Bexp(2iθ) of R(kx, ky) in the (kx, ky) plane is found, if B is B0exp(iα) (B0: a positive real number), the beam section is determined to be deformed in a direction which inclines at an angle of (−α/2) to the x- and y-axis directions. Further, α can be found from an angle between one of the axes of symmetry of the distribution R(kx, ky) and the kx axis.

Now referring to the flowchart of FIG. 1, a method based on the above-described principle for correcting astigmatism and focusing in the charged particle optical lens-barrel according to the embodiment of the invention will be described in detail.

First, in the charged particle optical lens-barrel, a secondary particle signal obtained by two-dimensionally scanning a sample with a charged particle beam is extracted at each of at least two focal distances zf and zf+Δ (step S1).

Fourier transformation data items I(kx, ky) and I' (kx, ky) indicative of the two-dimensional secondary particle signals extracted in the step S1 are obtained (step S2). Here, the extent of the measured area is finite and the data points are discrete. Therefore, in the actual use, the Fourier transform is finite and discrete. Subsequently, R(kx, ky) is calculated on the basis of the absolute values |I(kx, ky)| and |I' (kx, ky)| of I(kx, ky) and I' (kx, ky) obtained in the step S2. Fourier transformation data I" (kx, ky) in the third quadrant is obtained by further changing the focal distance by zf+2Δ. From I' (kx, ky) and I" (kx, ky), new R(kx, ky) (which will be referred to as "R2(kx, ky)") is calculated. This operation is repeated until the sign of an average value of Rn(kx, ky) (which means R(kx, ky) obtained in an n-th occasion of calculation) is reversed. Thereafter, supposing that the focal distances which are used to obtain Rn(kx, ky) are zf0 and zf0+Δ, measurement is performed at zf and 2zf0-zf to further obtain R(kx, ky) (which will be referred to as "Rf(kx, ky)") (step S3).

At the focal distance zf0, the beam section is substantially circular. The direction of astigmatism is determined on the basis of α included in Aexp(i(2θ+α)) or Aexp(−i(2θ+α)) (A: a non-negative number; α: a real number) which represents a component of R(kx, ky) proportional to exp(i2θ) or exp(−i2θ) of R(kx, ky) obtained at the angle θ in the kx-ky plane. (step S4)

Then, the stigmator is adjusted with $\alpha$ kept constant. To determine in which direction the stigmator should be operated so as to keep $\alpha$ constant, $\alpha$ is calculated by the above-described method, and a direction in which $\alpha$ is kept unchanged is found while the stigmator is finely moved angularly. The stigmator is adjusted so that the absolute value of A is minimized. (step S5)

To minimize A, the absolute value of A is directly calculated, or a method for reversing the sign of a component of R(kx, ky) which is proportional to $\exp(i(2\theta+\alpha))$ by changing the intensity of the stigmator is used. Any method can be employed to obtain Rf(kx, ky), only if the method can perform comparison of A. For example, measurement may be performed at zf0 in place with 2zf0-zf. In the above-described direction, astigmatism can be corrected.

To perform focusing, the focal distance of the lens is varied to find a boundary at which the sign of an average value of R(kx, ky) is substantially reversed. This boundary is considered as a position in which the focal point of the lens should be situated to obtain a focused image.

Highly accurate automatic astigmatism correction and automatic focusing can be performed by an astigmatism correction circuit and a focusing circuit which can realize the above-described operation.

As is evident from the description stated so far, R(kx, ky) is not always given by the above-described equation, but can be given, for example, by the following equations:

$$R(kx,ky)=(|I(kx,ky)|-|I'(kx,ky)|)/(|I(kx,ky)|+|I'(kx,ky)|)$$

$$R(kx,ky)=1n(|I(kx,ky)|/|I'(kx,ky)|)$$

$$R(kx,ky)=1-(|I(kx,ky)|/|I'(kx,ky)|)$$

Anyway, it suffices if a change in the absolute value of O(kx, ky) is reflected.

In the case where o(x, y) is not symmetric, O(kx, ky) can be a complex number. Actually, however, sufficiently approximate O(kx, ky) can be obtained, supposing that o(x, y) is symmetric in most cases.

In these cases, R(kx, ky) is given by

R(kx,ky) =Real((I(kx,ky)−I'(kx,ky))/(I(kx,ky)+I'(kx,ky)))
=((I(kx,ky)−I'(kx,ky))/(I(kx,ky)+I'(kx,ky)))

R(kx,ky) =( |I(kx,ky)|−|I'(kx,ky)|) /(|I(kx,ky)|+|I'(kx,ky)|)

In light of the above, it is convenient to calculation to use R(kx,ky)=(|I(kx,ky)|−|I'(kx,ky)|)/(|I(kx,ky)|+|I'(kx,ky)|).

Although the above description is directed to the case where the beam section is ideally of axial symmetry, i.e. the beam is a Gaussian beam, it can be also applied to a shaped beam of a rectangular or triangular section, or to a character beam of a voluntarily shaped section.

Supposing that an ideal configuration of the section of a beam on a sample is given by p(x, y), the actual current distribution j(x, y) is given by the following equation when the section of the beam is sufficiently small:

j(x, y)=∫∫q(x-x0, y-y0) p(x0, y0) dx0dy0 where q(x, y) represents the fuzziness of the beam.

An image i(x, y) obtained by scanning a shaped beam on the sample is given by i(x, y)=∫∫j(x-x0, y-y0) t(x0, y0) dx0dy0

This equation is subjected to Fourier transformation, whereby the following equation is obtained:

$$I(kx, ky)=J(kx, ky)T(kx, ky)$$

where J(kx, ky) represents Fourier transformation data corresponding to j(x, y).

Where Fourier transformation data items of q(x, y) and p(x, y) are represented by Q(kx, ky) and P(kx, ky), respectively, the following equation is obtained:

$$J(kx, ky)=Q(kx, ky)P(kx, ky)$$

Accordingly, I(kx, ky)=Q(kx, ky) P(kx, ky) T(kx, ky) is established.

On the basis of the above, suppose that R(kx, ky) is given by

R(kx, ky) =(I(kx,ky)−I'(kx,ky))/(I(kx,ky)+I'(kx,ky))

Then, the following equation is obtained:

$$R(kx, ky) =(Q(kx,ky)−Q'(kx,ky))/(Q(kx,ky)+Q'(kx,ky))$$

where Q' (kx, ky) represents Fourier transformation data indicative of q(x, y) at a focal distance differing from that at which Q(kx, ky) is obtained.

Thus, in the case of a shaped beam or a character beam, aberration is included in q(x, y), and accordingly correction of astigmatism and focusing can be performed by estimating q(x, y) in the same manner as described above concerning o(x, y).

In the method for correcting astigmatism and focusing in the charged particle microscope of the invention, Fourier transformation data items indicative of images of a sample obtained by scanning the sample with charged particle beams at different focal distances are obtained and subjected to calculation, thereby extracting data only on the configuration of the section of the beam. Accordingly, the direction of astigmatism is found and the focal distance at which a focused image can be obtained is determined with high accuracy, irrespective of the direction(s) in which the sample extends. This means that highly accurate astigmatism correction and focusing can be performed.

As described above, the invention can provide a method for correcting astigmatism and focusing in a charged particle optical lens-barrel, which enables prompt and accurate astigmatism correction and prevents reduction of accuracy due to the configuration of a sample or a beam section.

The accuracy of correction can be enhanced by sequentially reducing the width between adjacent scale points for setting the focal distance. Specifically, if the focal distance at which a focused image is obtained is detected to be z3 after astigmatism correction and focusing are performed using images obtained at focal distances z1, z2, z3, z4 and z5, respectively, correction and focusing are again performed using images obtained at focal distances z2, (z2+z3)/2, (z3+z4)/2, and z4. Repeating this operation enables focusing with a voluntary accuracy.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of correcting astigmatism and focusing in a charged particle optical lens-barrel, comprising:
   the first step of extracting secondary particle signals obtained by two-dimensionally scanning a sample with a charged particle beam when the focal distance of an objective lens is set to each of at least two different values which include a first objective lens value and a second objective lens value;
   the second step of representing Fourier transformation data in a two-dimensional region indicative of the secondary particle signals extracted in the first step when the focal distance of the objective lens is set to the first objective lens value and the second objective lens value by I(kx, ky) and I'(kx, ky), respectively;

the third step of calculating a function, $R(kx, ky)$, which determines a sign distribution representative of an astigmatism on the basis of the absolute values $|I(kx, ky)|$ and $|I'(kx, ky)|$ of $I(kx, ky)$ and $I'(kx, ky)$ represented in the second step;

the fourth step of determining the direction of astigmatism on the basis of $\alpha$ obtained when that component of $R(kx, ky)$ calculated in the third step, which is proportional to $\exp(i2\theta)$ or $\exp(-i2\theta)$ of $R(kx, ky)$ obtained at an angle $\theta$ in a kx-ky plane, is represented by $A\exp(i(2\theta+\alpha))$ or $A\exp(-i(2\theta+\alpha))$ where A is a non-negative number and $\alpha$ is a real number; and the fifth step of adjusting a stigmator so as to minimize the real number.

2. The method according to claim 1, wherein a boundary at which the sign of an average value of $R(kx, ky)$ is reversed is found by varying the focal distance of the objective lens, the boundary being used as a position in which the focal point of the objective lens should be situated to obtain a focused image.

3. The method according to claim 1, wherein a component of $R(kx, ky)$ which is proportional to $\exp(i2\theta)$ is compared with a component of $R(kx, ky)$ which is proportional to $\exp(i0\theta)$, and the stigmator is adjusted so that the absolute value of the first-mentioned component can be lower than a predetermined value.

4. The method according to claim 1, wherein the configuration of the section of the charged particle beam on the sample is at least one of a rectangle, a triangle, and a voluntary character configuration.

5. The method according to claim 1, wherein $R(kx, ky)$ is given by one of the following equations:

$$R(kx,ky)=((I(kx,ky)-I'(kx,ky))/(I(kx,ky)+(I'(kx,ky)))$$

$$R(kx,ky)=\text{Real}\ ((I(kx,ky)-I'(kx,ky))/(I(kx,ky)+(I'(kx,ky))))$$

$$R(kx,ky)=(|I(kx,ky)|-|I'(kx,ky)|)/(|I(kx,ky)|+|I'(kx,ky)|)$$

$$R(kx,ky)=1n(|I(kx,ky)|/|I'(kx,ky)|)$$

$$R(kx,ky)=1-(|I(kx,ky)|/|I'(kx,ky)|).$$

6. The method according to claim 5, wherein a boundary at which the sign of an average value of $R(kx, ky)$ is reversed is found by varying the focal distance of the objective lens, the boundary being used as a position in which the focal point of the objective lens should be situated to obtain a focused image.

7. The method according to claim 5, wherein a component of $R(kx, ky)$ which is proportional to $\exp(i2\theta)$ is compared with a component of $R(kx, ky)$ which is proportional to $\exp(i0\theta)$, and the stigmator is adjusted so that the absolute value of the first-mentioned component can be lower than a predetermined value.

8. The method according to claim 5, wherein the configuration of the section of the charged particle beam on the sample is at least one of a rectangle, a triangle, and a voluntary character configuration.

9. The method according to claim 1, wherein if the focal distance of the objective lens at which a focused image is obtained is detected to be z3 after astigmatism correction and focusing are performed using images obtained at focal distances z1, z2, z3, z4 and z5, respectively, correction and focusing are again performed using images obtained at focal distances z2, (z2+z3)/2, (z3+z4)/2, and z4.

10. A method of correcting astigmatism and focusing in a charged particle optical lens-barrel, comprising:

the first step of extracting secondary particle signals obtained by two-dimensionally scanning a sample with a charged particle beam when the focal distance of an objective lens is set to each of at least two different values which include a first objective lens value and a second objective lens value;

the second step of representing by $I(kx, ky)$ and $I'(kx, ky)$, Fourier transformation data in a two-dimensional region indicative of the secondary particle signals extracted in the first step when the focal distance of the objective lens is set to the first objective lens value and the second objective lens value, respectively;

the third step of calculating a function, $R(kx, ky)$, which determines a sign distribution representative of an astigmatism on the basis of the absolute values $|I(kx, ky)|$ and $|I'(kx, ky)|$ of $I(kx, ky)$ and $I'(kx, ky)$ represented in the second step;

the fourth step of further changing the focal distance to a third objective lens value to obtain Fourier transformation data $I''(kx, ky)$ in a third quadrant, then updating $R(kx, ky)$ on the basis of $I'(kx, ky)$ and $I''(kx, ky)$, repeating this operation until the sign of an average value of $R(kx, ky)$ is reversed, and calculating $R(kx, ky)$ on the basis of a focal distance at which the sign is reversed;

the fifth step of determining the direction of astigmatism on the basis of $\alpha$ obtained when that component of $R(kx, ky)$ calculated in the third step, which is proportional to $\exp(i2\theta)$ or $\exp(-i2\theta)$ of $R(kx, ky)$ obtained at an angle $\theta$ in a kx-ky plane, is represented by $A\exp(i(2\theta+\alpha))$ or $A\exp(-i(2\theta+\alpha))$ where A is a non-negative number and $\alpha$ is a real number; and the sixth step of adjusting a stigmator so as to minimize the real number.

11. The method according to claim 10, wherein $R(kx, ky)$ is given by one of the following equations:

$$R(kx,ky)=((I(kx,ky)-I'(kx,ky))/(I(kx,ky)+(I'(kx,ky)))$$

$$R(kx,ky)=\text{Real}\ ((I(kx,ky)-I'(kx,ky))/(I(kx,ky)+(I'(kx,ky))))$$

$$R(kx,ky)=(|I(kx,ky)|-|I'(kx,ky)|)/(|I(kx,ky)|+|I'(kx,ky)|)$$

$$R(kx,ky)=1n(|I(kx,ky)|/|I'(kx,ky)|)$$

$$R(kx,ky)=1-(|I(kx,ky)|/|I'(kx,ky)|).$$

* * * * *